(12) United States Patent
Reinmuth et al.

(10) Patent No.: US 8,607,447 B2
(45) Date of Patent: Dec. 17, 2013

(54) METHOD FOR PROVIDING AND CONNECTING TWO CONTACT AREAS OF A SEMICONDUCTOR COMPONENT OR A SUBSTRATE, AND A SUBSTRATE HAVING TWO SUCH CONNECTED CONTACT AREAS

(75) Inventors: Jochen Reinmuth, Reutlingen (DE); Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 241 days.

(21) Appl. No.: 13/004,427

(22) Filed: Jan. 11, 2011

(65) Prior Publication Data

US 2011/0169169 A1    Jul. 14, 2011

(30) Foreign Application Priority Data

Jan. 14, 2010   (DE) .......................... 10 2010 000 892

(51) Int. Cl.
*H01L 23/488* (2006.01)
*H01L 21/768* (2006.01)

(52) U.S. Cl.
USPC ................... 29/852; 29/842; 29/846; 29/883; 361/760; 257/773

(58) Field of Classification Search
USPC ............. 361/760; 257/773; 29/842, 846, 852, 29/883
See application file for complete search history.

(56) References Cited

U.S. PATENT DOCUMENTS

| 7,578,189 B1 * | 8/2009 | Mehregany ................ 73/514.18 |
| 2008/0128803 A1 * | 6/2008 | Hirler et al. ................... 257/331 |
| 2008/0142928 A1 | 6/2008 | Sitaram et al. |

FOREIGN PATENT DOCUMENTS

DE    10 2007 059 337    7/2008

* cited by examiner

*Primary Examiner* — Tuan T Dinh
*Assistant Examiner* — Mukund G Patel
(74) *Attorney, Agent, or Firm* — Kenyon & Kenyon LLP (57) ABSTRACT

A method for providing and connecting a first contact area to at least one second contact area on a substrate, in particular in the case of a semiconductor component, which includes providing at least one insulation layer on the substrate, forming an opening in the at least one insulation layer over at least one insulation trench of a first contact area, applying at least one metal layer to the insulation layer, forming the first and second contact areas in the at least one metal layer and at least one printed conductor between the two contact areas, and forming the insulation trench.

10 Claims, 12 Drawing Sheets

METHOD FOR PROVIDING AND CONNECTING TWO CONTACT AREAS OF A SEMICONDUCTOR COMPONENT OR A SUBSTRATE, AND A SUBSTRATE HAVING TWO SUCH CONNECTED CONTACT AREAS

RELATED APPLICATION INFORMATION

The present application claims priority to and the benefit of German patent application no. 10 2010 000 892.3, which was filed in Germany on Jan. 14, 2010, the disclosure of which is incorporated herein by reference.

FIELD OF THE INVENTION

The present invention relates to the provision and connection of two contact areas on a semiconductor component or a substrate, and a substrate having two contact areas connected to one another, one contact area being a through contact in particular.

BACKGROUND INFORMATION

There are electrical contacts through a wafer or through a subarea of a wafer in greatly varying embodiments. These through contacts are becoming increasingly significant. If multiple components are placed vertically one on top of another, very beneficial and small-dimensioned arrangements may be obtained by integrating electrical through contacts into the component.

A semiconductor component is discussed in German patent document DE 10 2007 059 337 A1, which has multiple through contacts, in order to be able to interconnect the semiconductor component with another semiconductor component, for example.

SUMMARY OF THE INVENTION

According to the exemplary embodiments and/or exemplary methods of the present invention, a method is provided in which a first contact area is connected to a second contact area, the second contact area being provided in an area which is unused by the substrate or wafer, for example.

More precisely, a method is provided for providing and connecting a first contact area to at least one second contact area on a substrate wafer, in particular in the case of a semiconductor component, for example, a micromechanical or electrical semiconductor component, having the following steps:

providing at least one insulation layer on the substrate,
forming an opening in the at least one insulation layer over at least one insulation trench of a first contact area;
applying at least one metal layer to the insulation layer;
forming the first and second contact areas in the at least one metal layer and at least one printed conductor between the two contact areas;
forming the insulation trench.

The method has the advantage that the second contact area may be provided at any desired point on the substrate or wafer, for example, in a free area of the substrate or wafer which is usable as a contact. With the aid of the method according to the present invention, the first contact area, which is a through contact, for example, may be connected very easily to this second contact area. The insulation trench does not necessarily have to be closed for this purpose, but rather may remain open or at least partially open, the printed conductor running freely suspended over the insulation trench and optionally being able to have, in addition to at least one metal layer, at least one additional layer, such as a dielectric layer or a diffusion barrier layer. With the aid of the method according to the present invention, substrates having one or more semiconductor components may thus be produced, the substrate providing contact areas according to the present invention which may be connected to one another.

Advantageous embodiments and refinements of the present invention result from the subclaims and the description with reference to the drawings.

The exemplary embodiments and/or exemplary methods of the present invention are explained in greater detail hereafter on the basis of the exemplary embodiments specified in the schematic figures of the drawings.

BRIEF DESCRIPTION OF THE DRAWINGS

FIG. 5b shows a top view of the wafer or the substrate according to FIG. 5a.

FIG. 6b shows a top view of the wafer or the substrate according to FIG. 6a.

FIG. 7b shows a top view of the wafer or the substrate according to FIG. 7a.

DETAILED DESCRIPTION

In all figures, identical or functionally identical elements and devices—if not specified otherwise—have been provided with the same reference numerals. Furthermore, the illustration of the wafer or that of the substrate or the semiconductor components in the following figures is shown purely schematically, not to scale, and greatly simplified.

Figure 1:
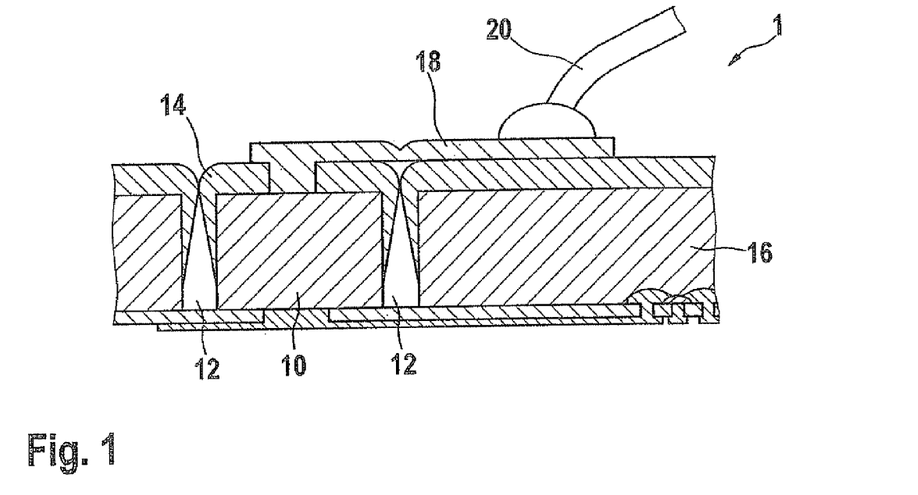
FIG. 1 shows a sectional view through a wafer or a substrate, which has a through contact including an insulation trench, the insulation trench being closed via an oxide filling.

FIG. 1 shows a wafer 1, in which a through contact 10 is provided, through contact 10 being enclosed by an insulation trench 12. Trench 12 is closed in the example in FIG. 1 using an oxide filling 14 in this case.

A particularly simple method for manufacturing through contacts is to use a conductive substrate 16 and to use the substrate material itself as the printed conductor. Conductive substrate material 16 is removed in a trench 12 around a through contact 10, as shown in FIG. 1. A trenching process may be used for this purpose, using which a narrow insulation ring or trench 12 having a very high aspect ratio is etched.

Many processing variants are aimed at subsequently closing trench 12 and achieving the smoothest possible surface. The advantage of such a procedure is that after the closing of trench 12, rewiring is possible on a smooth surface, for example. Contact surfaces or contact area 18 for bonding wires 20 or other electrical connection surfaces do not have to be situated on a conductive stamp made of substrate material. Depending on the method, this may prove to be very beneficial, since either the stamp does not have the required stability for establishing a connection, or because a relatively large surface is required for the connection, which would result in oversized stamps. In contrast, both restrictions may be bypassed using electrical rewiring of the contact surfaces or contact areas according to the present invention on free surfaces, for example, which may be used as contact surfaces, for example.

As shown in FIG. 1, rather narrow trenches 12 are produced around through contacts 10, these trenches being closed by a deposit of an oxide layer 14 close to the surface. Smoothing of the oxide closure may be achieved in this case via an optional planarization step. This method proves to be relatively complex.

Figure 2:
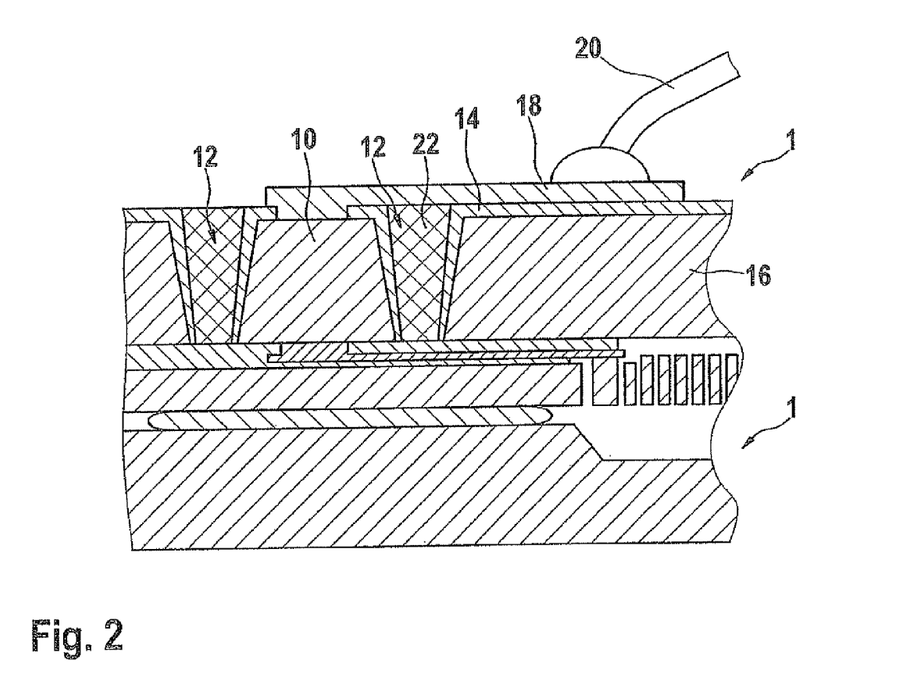
FIG. 2 shows a sectional view through a wafer or a substrate, which has a through contact including an insulation trench, the insulation trench being closed via a polysilicon deposit.

Furthermore, a stack made of multiple wafers 1 is shown in FIG. 2, a through contact 10 being formed through a subarea of the wafer stack. Trench 12 is formed around through contact 10 having a slightly open geometry. Subsequently, trench 12 is closed using an oxide layer 14 for insulation and a polysilicon deposit 22 for filling, for example. In order to obtain a smooth through contact 10, the surface must still be planarized thereafter. The method for closing the trench according to FIG. 2 also proves to be complex.

Figure 3:
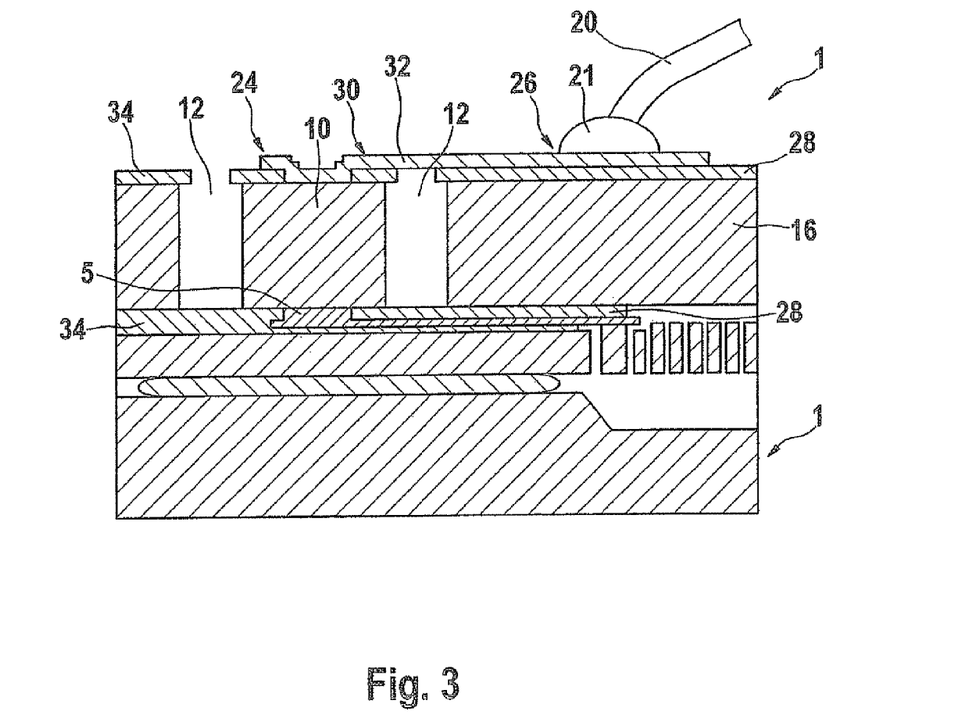
FIG. 3 shows a sectional view of a wafer or a substrate, which is manufactured with the aid of the method according to the present invention, the through contact of the substrate including an insulation trench being connected via a printed conductor to a second contact area.

As shown in FIG. 3, a method according to the present invention is provided, which allows rewiring to be applied without a closure of trenches 12 or insulation trenches, a first contact area 24, for example, a through contact 10 here, being conductively connected to a second contact area 26, which is located on a what may be free substrate area, electrically insulated from the substrate. Substrate 16, which is implemented as conductive, for example, may additionally have a contact 5 on an opposite side, for example, which is connected to through contact 10 and is optionally additionally embedded in at least one insulation layer 28, for example, at least one dielectric layer 34. This is true for all specific embodiments of the present invention. This contact 5 is conductively connected via through contact 10 according to the present invention, for example, to a bond or bond pad 21 and a bonding wire 20.

Very large trenches 12 may also be applied if needed as per the method according to the present invention. Trenches 12 may also optionally be additionally closed in the following process steps, for example, filled using a molding compound or another suitable material or material combination, for example. Trenches 12, as shown in following Figure, may also be insulated using at least one insulation layer, such as an oxide layer or a dielectric layer, and optionally additionally also filled using a molding compound, for example.

According to the exemplary embodiments and/or exemplary methods of the present invention, prior to the etching of particular trench 12, at least one insulation layer 28 having one or more defined contacts to one or more individual substrate areas, in particular to the stamps, is already applied. A metal plane 30 made up of at least one or more metal layers is applied, the particular metal layer including metal or a metal alloy, which is true for all specific embodiments of the present invention. The contact areas on the stamps or through contacts 10 are transferred via fine printed conductors or webs 32 to new contact area(s) 26, which may be located insulated on free or unused substrate areas, for example. For example, the electrical connection to the outside may be performed subsequently via this particular new contact area 26. Particular trench 12 or an insulation trench is then applied around the stamps or through contact 10 here, for example, using etching, such as an isotropic and/or anisotropic etching process, such as trenching. This is true for all specific embodiments of the present invention. The trench is formed in such a way that fine metal printed conductors 32 or metal plane 30 may be completely undercut in subareas and one or more printed conductors or narrow webs 32 remain standing.

Figure 11:
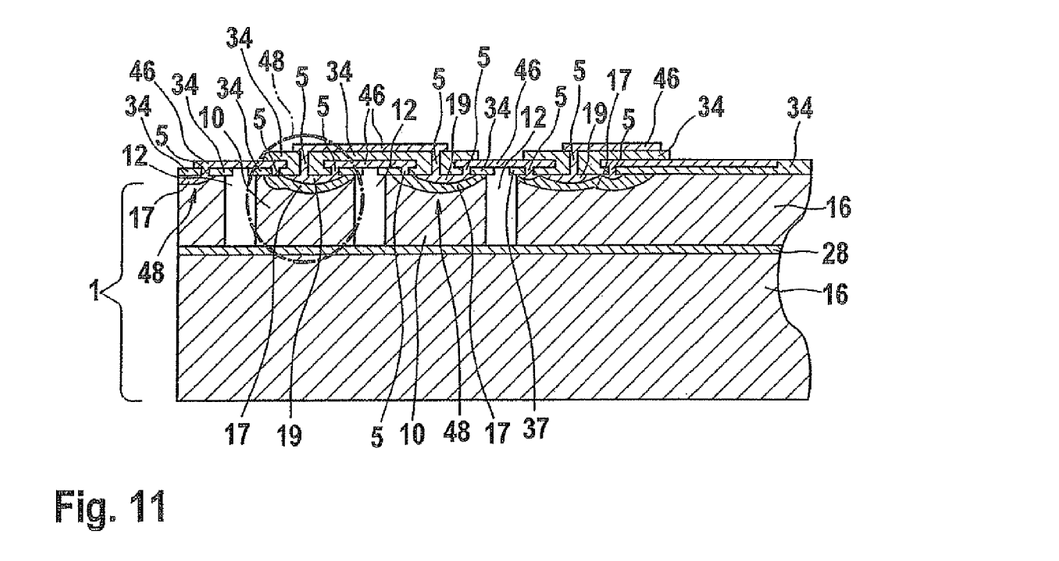
FIG. 11 shows a sectional view through a wafer or a substrate according to a specific embodiment of the present invention, in which metal bridges are provided.

In a further application of this technology, one or more electrically insulated areas 24 may be established over trenches 12, as shown in following FIG. 11, which contain one or more electrical elements, which may be connected to one another and/or to the remaining elements via one or more metal bridges, for example.

An advantage of the method according to the present invention is that very wide trenches 12 may be produced using this method. In addition, very high etching rates may be achieved. Furthermore, closure of trenches 12 may be completely dispensed with. However, closure of trenches 12 may fundamentally also be performed if needed, which may be first during subsequent processing steps. Trenches 12 may be closed using a molding compound and thus be additionally stabilized, for example. A further advantage of the method according to the present invention is that the establishment of contact surfaces or contact areas 24, 26 and the structuring of metal plane 30 may take place prior to the etching, for example, the trenching process. Very simple and precise processing is possible in this case. Another advantage is that the method according to the present invention does not require high temperature steps. It may thus also be used as a via-last process having temperature-sensitive prior processes. Overall, the method according to the present invention is a simple and cost-effective process. In addition, wiring using more than one metal plane is possible as per the method according to the present invention.

Figure 4A:
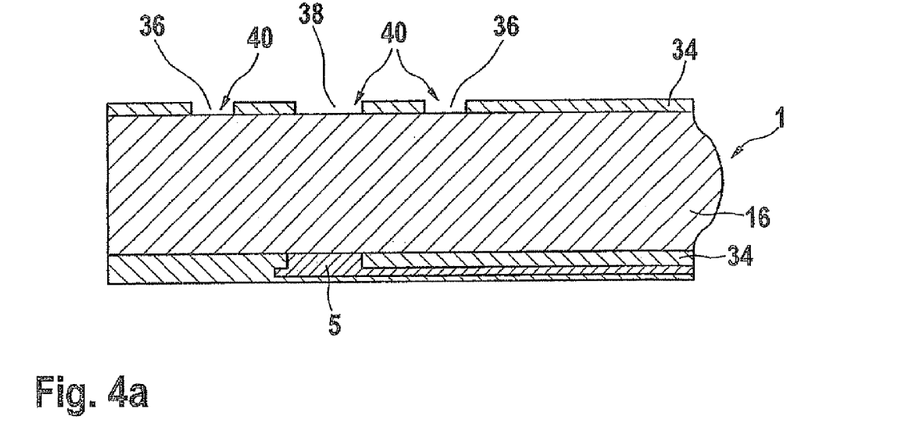
FIG. 4a shows a sectional view through a wafer or a substrate according to a first step of the method according to the present invention.
Figure 4B:
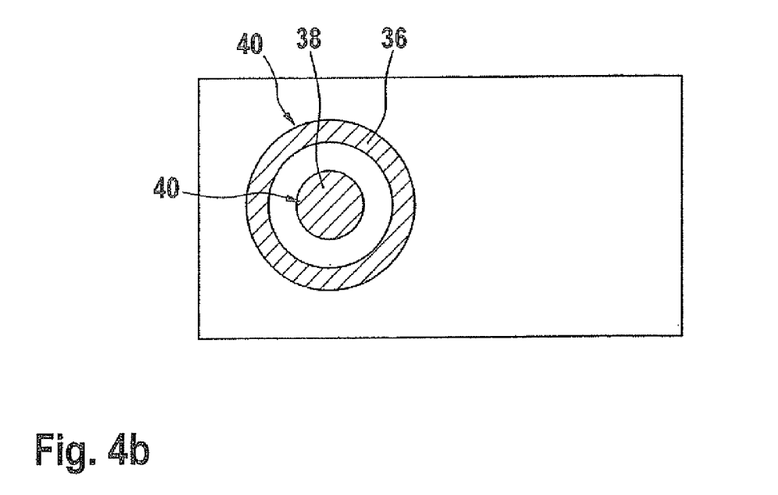
FIG. 4b shows the wafer or the substrate according to FIG. 4a in a top view.

A wafer 1 having a substrate 16, for example, a conductive substrate, is shown in FIG. 4a in a lateral sectional view and in FIG. 4b in a top view. Substrate 16 has at least one contact 5 on one side, the underside here, for example, and optionally additionally at least one insulation layer, for example, a dielectric material or at least one dielectric layer 34, for example.

On the other side, the top side here, as shown in FIGS. 4a and 4b, an insulation layer, such as a dielectric material or at least one dielectric layer 34, for example, is applied to substrate 16. For example, a TEOS layer may be deposited as dielectric layer 34. In areas 36 in which etching or trenching is to be performed subsequently to provide a trench 12 around a through contact 10, for example, and in areas 38, for example, in the areas of through contacts 10, in each of which a contact to substrate 16 is to be established, the dielectric material is opened or dielectric layer 36 is provided with openings 40. Alternatively, the oxide opening or the opening of the dielectric material in areas 36 may also be performed subsequently after structuring of the metal plane, the metal plane having at least one metal layer as described above.

Figure 5A:
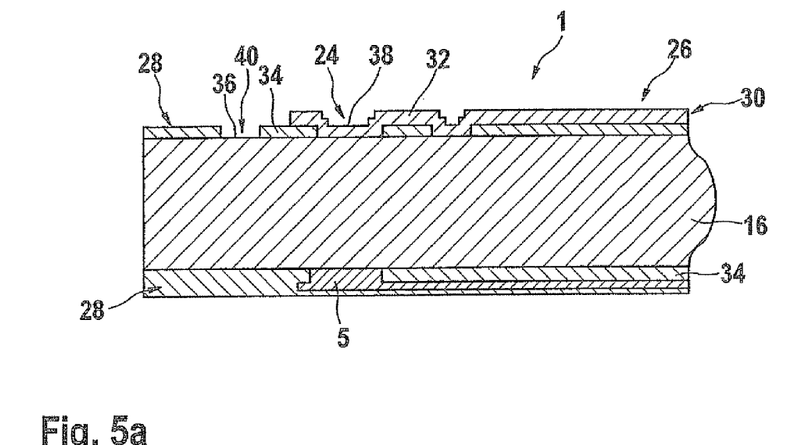
FIG. 5a shows the sectional view of the wafer or the substrate according to FIG. 4a, an additional metal layer being deposited on the substrate.
Figure 5B:
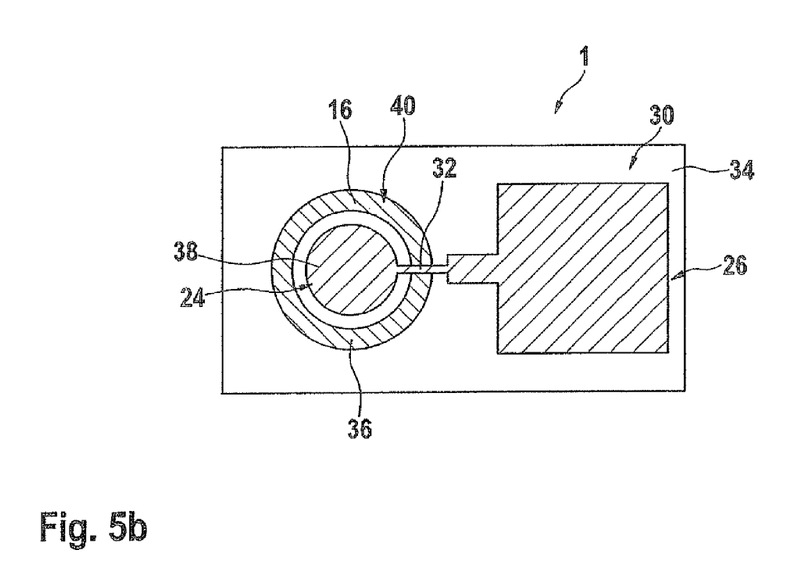

FIGS. 5a and 5b show wafer 1 and substrate 16 having dielectric layer 34 and its openings 40 according to FIGS. 4a and 4b, at least one further layer additionally being deposited, at least one metal layer here, on substrate 16 or dielectric layer 34. FIG. 5a shows wafer 1 and substrate 16 in a lateral sectional view and FIG. 5b shows wafer 1 and substrate 16 in a top view.

As may be inferred from FIGS. 5a and 5b, at least one metal layer is subsequently deposited on substrate 16 and the insulation layer, dielectric layer 34 here, for example, to form metal plane 30. In areas 36 in which trenches 12 should be created around through contacts 10, for example, and dielectric layer 34 has corresponding openings 40, applied metal layer or metal plane 30 is subsequently opened or provided with openings, as shown in FIGS. 5a and 5b. At least one or more printed conductors or webs 32 are guided over these areas 36, trench 12 around through contact 10 in FIG. 5b here. At least one dielectric layer, as shown in following FIGS. 7a and 7b, and/or at least one diffusion barrier (not shown), such as a TiN layer, may optionally also be located or provided below printed conductors or webs 32. Particular web 32 may be implemented as very narrow or sufficiently narrow to be able to be completely undercut in a subsequent processing step. Metal plane 30, as shown as an example in FIGS. 5a and 5b, connects via particular web 32 first contact area 24, where a contact to substrate 16 or a contact 5 is to be established, to a new, second contact area 26 in another, which may be free or unused substrate area. Contact areas 24 on the stamps may be transferred via at least one assigned printed conductor or web 32 to new contact areas 28, which are located insulated in free substrate areas, for example. In the exemplary embodiment shown in FIGS. 5a and 5b, the subsequent through contact is connected on one side to contact 5, which is optionally additionally embedded in at least one insulation layer 28, for example, a dielectric layer 34. Via web 32, which is implemented as a printed conductor, contact 5 may be connected in this case via the subsequent through contact, as shown in following FIGS. 6a and 6b, and web 32 to another, second contact area 26 on the opposite side of wafer 1.

Figure 6A:
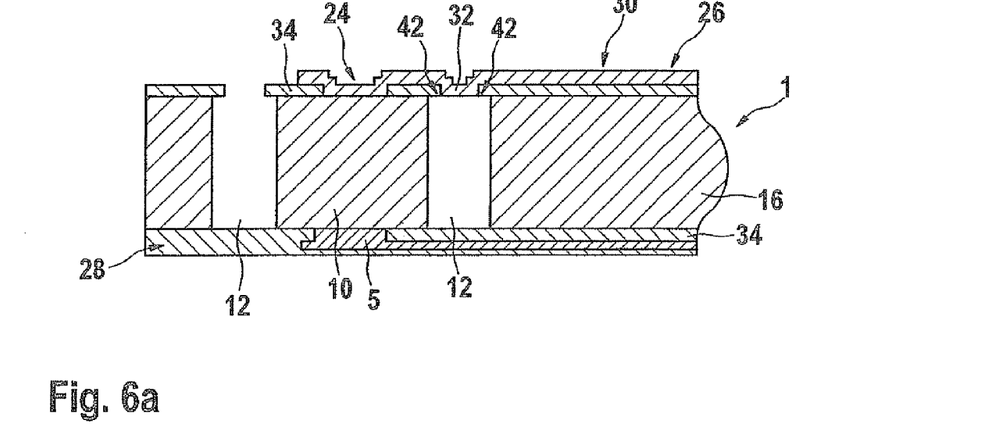
FIG. 6a shows a sectional view of a wafer or a substrate according to a further specific embodiment of the present invention.
Figure 6B:
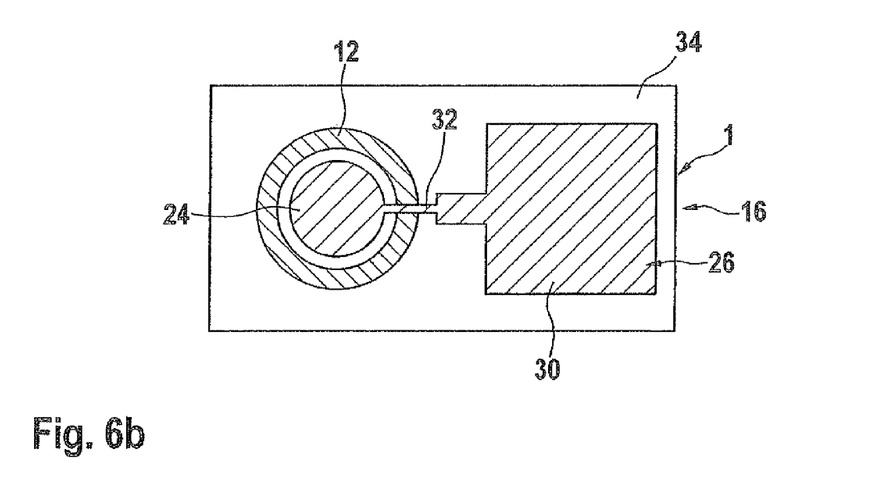

FIGS. 6a and 6b show wafer 1 and substrate 16 having additional metal plane 30 according to FIGS. 5a and 5b, a trench 12 being formed around through contact 10 and through contact 10 being connected to a contact 5 on one side, which may additionally be embedded in at least one insulation layer 28, such as a dielectric layer 34, for example. FIG. 6a shows wafer 1 and substrate 16 in a lateral sectional view and FIG. 6b shows wafer 1 and substrate 16 in a top view in this case.

Dielectric layer 34 and metal plane 30 are used hereafter as masks for an etching process, such as an anisotropic trenching process, in order to form a trench 12 around through contact 10 of substrate 16 in the example shown in FIGS. 6a and 6b. In special cases, processing may additionally or alternatively also be performed using a resist mask or another mask. During the subsequent trenching process, the processing parameters for the etching and passivation steps are selected in such a way that complete undercutting may occur directly below metal web 32 and on an oxide edge 42 of trench 12, for example. The undercutting of fine metal web 32 and oxide edge 42 may also be performed in a processing step following the trenching. Firstly, the passivation layer which resulted during the trenching is suitably removed. Subsequently, for example, the silicon walls located below webs 32 of the mask are removed using what may be an isotropic etching method. During the anisotropic etching method, for example, a gas may be used, such as $SF_6$, $ClF_3$, $XeF_2$, or another suitable gas.

Figure 7A:
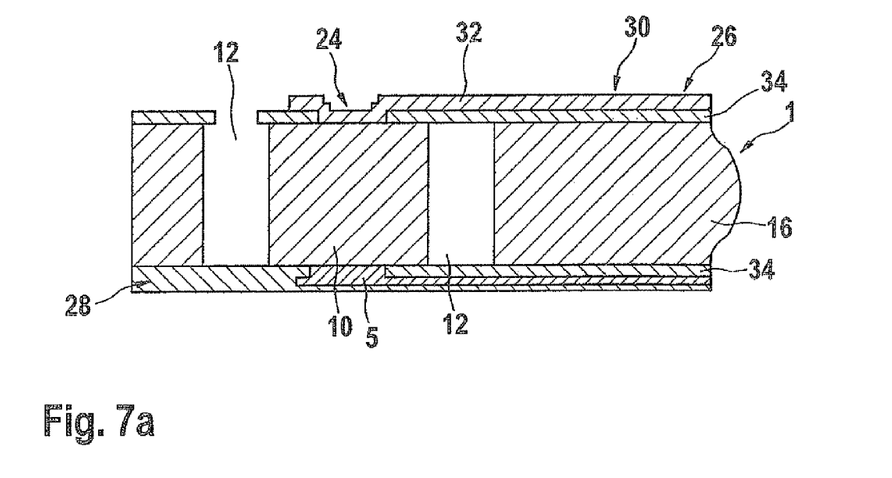
FIG. 7a shows a sectional view of a wafer or a substrate according to a specific embodiment of the present invention.
Figure 7B:
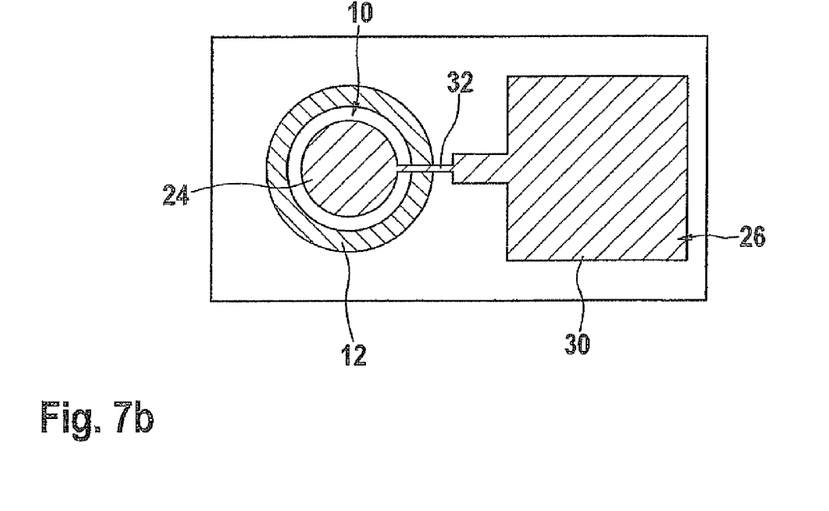

A further specific embodiment of the method according to the present invention is shown in FIGS. 7a and 7b. In FIG. 7a, a wafer 1 and a substrate 16 are shown in a sectional view, at least one insulation layer, such as a dielectric layer 34, having been deposited on substrate 16. In contrast to the specific embodiment according to the present invention as shown in FIGS. 4 through 6, insulation layer or dielectric layer 34 has not been opened or provided with an opening in the area where particular metal web 32 is subsequently formed. In other words, dielectric layer 34 remains in the area of metal web 32 in FIGS. 7a and 7b and also does not necessarily have to be removed subsequently during the formation of trench 12 around through contact 10, but rather may remain, as shown in the figures.

Dielectric layer 34 may terminate laterally at web 32, as indicated in FIG. 7b, or may protrude laterally beyond web 32 (not shown). Furthermore, instead of or in addition to dielectric layer 34, at least one other layer, such as a TiN layer as a diffusion barrier, may be provided under web 32. In the specific embodiment shown in FIGS. 7a and 7b, for example, a contact 5 on one side of wafer 1, contact 5 additionally being able to be embedded in at least one insulation layer 28, such as a dielectric layer 34, is electrically connected to a further contact area 26 on the other side of wafer 1 via through contact 10 and web 32.

Figure 8:
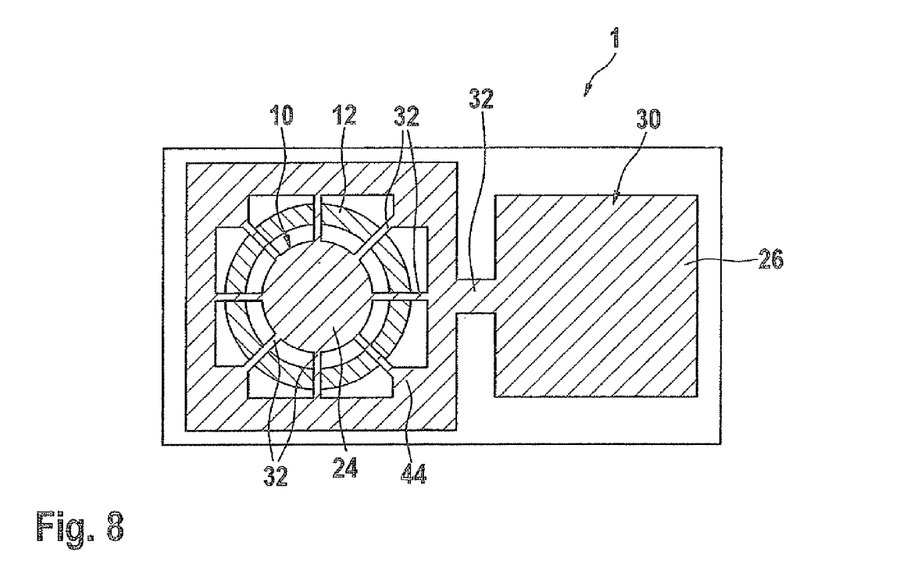
FIG. 8 shows a top view of a wafer or a substrate according to a further specific embodiment of the present invention.

A further wafer 1 and a substrate 16 according to the present invention are shown in FIG. 8, wafer 1 and substrate 16 being shown in a top view.

In this specific embodiment, a stable through contact 10 may be achieved in that the stamp or through contact 10 here is attached to multiple metal webs 32. Metal webs 32 may be situated symmetrically. However, they may also be situated asymmetrically or as desired.

For metal webs 32 it proves to be advantageous to use metals, such as aluminum, having tensile stress or a corresponding metal alloy having tensile stress. Through contact 10 may be stabilized through the use of such metals or metal alloys, similarly to the spokes of a wheel, via the tensile stress of the contact stamp. If conductive materials having compressive stress are used as webs 32, for example, it proves to be advantageous if these are either laid in a suitable lattice structure (not shown) or in meandering form (not shown) over particular trench 12, for example, to give metal plane 30, or the metal layer here, a possibility for relaxation, in order to prevent sagging or so-called buckling of webs 32 or printed conductors.

In addition, it proves to be advantageous to optionally additionally guide a narrow printed conductor or web 32 over trench 12 on at least one layer which is also narrow, such as an oxide layer, dielectric layer, and/or TiN layer, etc. An additional stabilization is thus also achieved, as previously shown as an example on the basis of a dielectric layer below the web in FIGS. 7a and 7b and in following FIG. 10.

Figure 9:
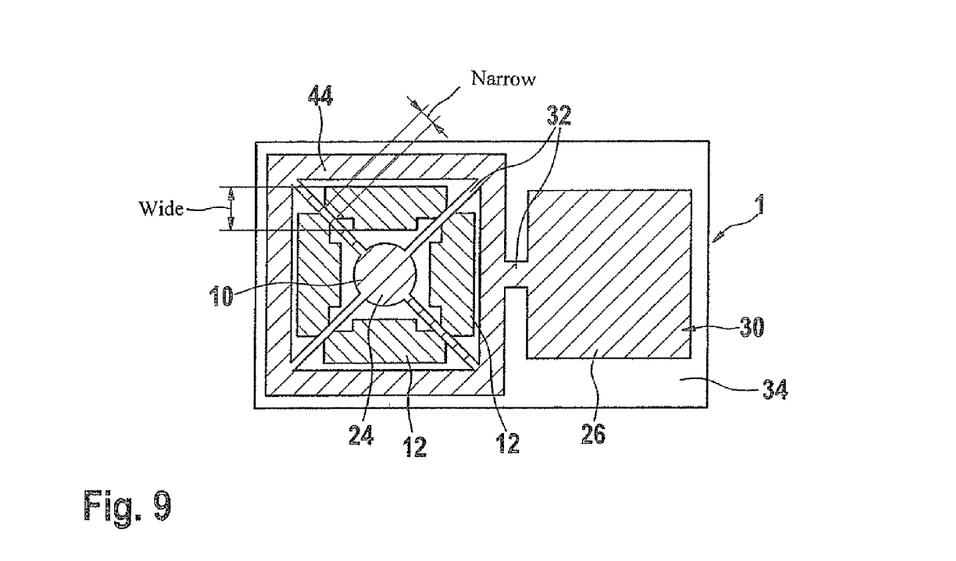
FIG. 9 shows a top view of a wafer or a substrate according to another specific embodiment of the present invention.

Through suitable shaping of trenches 12, in which the shortest possible areas may be spanned by printed conductors or webs 32, it may additionally be ensured that the freestanding printed conductors or webs 32 may additionally be stabilized further. As shown in FIG. 8 and following FIG. 9, areas, for example, very large areas, may be defined in which substrate 16 is etched. For example, a ring-shaped trench 12 is provided in FIG. 8. Contact area 24, through contact 10, for example, in the middle is connected in this case via short printed conductors or webs 32 to at least one new contact area 26 on what may be an unused substrate area. The printed conductors or webs 32 run from the contact or contact area 24 over ring-shaped trench 12 and are then connected to a connection section 44 in the form of a polygonal metal ring of metal plane 30, for example. For example, at least one printed conductor or web 32 runs from polygonal ring section or connection section 44 to at least one further contact area 26.

Another specific embodiment according to the present invention of a wafer 1 and a substrate 16 is shown in FIG. 9, wafer 1 and substrate 16 being shown in a top view.

In this specific embodiment, the actual etching area or trenching area is significantly narrowed in the areas in which the narrow metal printed conductors or webs 32 are provided. The metal printed conductor or web 32 may be only freely suspended over a small distance. However, the individual opening surfaces for the etching, such as the trench, remain very large, for example, and therefore etching may be performed using a good etching rate or trenching rate. In addition, large openings or trenches 12 additionally allow good filling behavior for closing the openings or trenches 12 during subsequent processes, if this is desired. In the example shown in FIG. 9, a trench 12, for example, in the form of an essentially polygonal ring, which is optionally narrowed where the printed conductors or webs 32 are guided, is provided around the contact or contact area 24.

The printed conductors or webs 32 are guided from contact area 24 over trench 12 to a connection section 44 of metal plane 30 or are connected thereto. At least one printed conductor or one web 32 in turn leads from connection section 44 of metal plane 30 to at least one new contact area 26, which may be on an unused area of the substrate. Connection section 44 of metal plane 30 is also implemented as polygonal in FIG. 9, for example. Fundamentally, however, it may have any desired shape, as far as it may be connected to the printed conductor(s) of the contact area. In principle, the number, shape, positioning, and dimensioning of trenches 12, of the conductors or webs 32, and of connection sections 44, to which the printed conductors or webs 32 are connected, may be varied as desired. This is true for all specific embodiments of the present invention.

Figure 10:
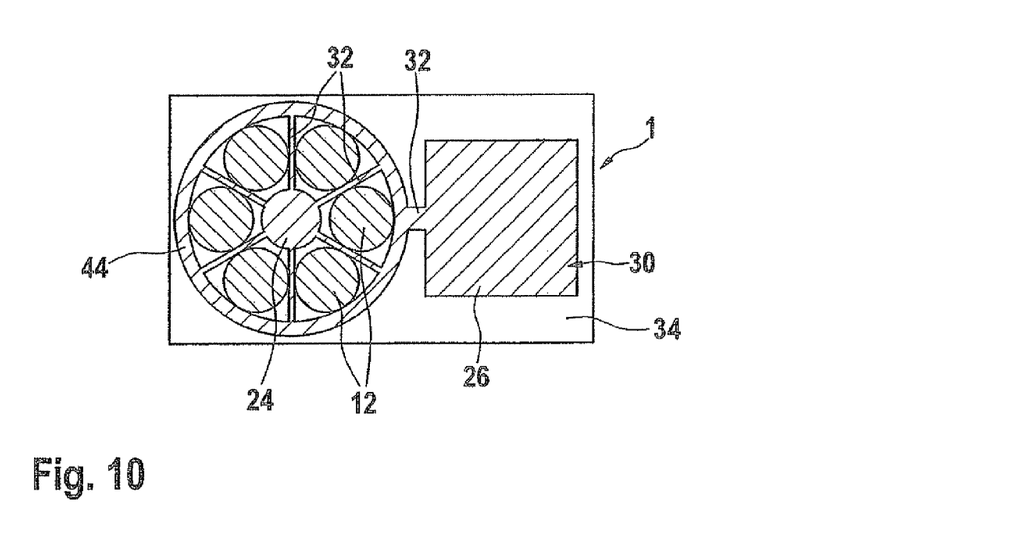
FIG. 10 shows a top view of a wafer or a substrate according to an additional specific embodiment of the present invention.

A further specific embodiment according to the present invention of a wafer 1 and a substrate 16 is shown in a top view in FIG. 10.

In this specific embodiment, for example, multiple round trenches 12 or trench sections, for example, are provided, which are etched, for example, trenched. Round trenches 12 are situated in relation to one another, for example, in a circle, in such a way that they merge into one another or form a continuous trench 12. Webs 32 may be situated in the transition areas of each two trenches or circular trench sections, since they have only to be implemented as freestanding over a small section here. One printed conductor or one web 32 runs between trenches 12, for example, from a contact or contact area 24 in the middle of the circle to a round connection section 44, for example, which connects the printed conductors or webs 32 to one another and which has at least one further printed conductor or web 32, which is connected to at least one new contact area 26. New contact area 26 is provided outside through contact 10 and trenches 12 or trench sections in another area of substrate 16, which may be in a previously free or unused area of the substrate.

An additional specific embodiment of a wafer 1 and a substrate 16 according to the present invention is shown in FIG. 11.

Wafer 1 and substrate 16 are shown in a sectional view, wafer 1 and substrate 16 being provided with multiple metal bridges 46.

Metal printed conductors or webs 32 may have a high tensile or compressive stress. In order to compensate for negative effects which are caused by this stress, it proves to be advantageous to manufacture bridges, such as metal bridges 46, which span a corresponding trench 12. Bridges or metal bridges 46 may have a shape by which a compensation of stress, such as tensile or compressive stresses, is made possible in the event of bending of metal bridge 46 within the plane. Metal bridges 46 may have an S-shape or a meandering shape, for example, to name only two possible examples for the shape of a bridge.

To be able to provide wide bridges 46 which may carry high currents, multiple, also narrower bridges 46 may be applied in parallel over a trench 12, for example. It also proves to be particularly advantageous to provide a wide bridge 46, which has at least one or more perforations (not shown), to ensure that bridge 46 is undercut everywhere in an etching process, for example, and the bridge may additionally carry high currents. Through a suitable shape, number, and/or dimensioning of the perforations, a tensile or compressive stress of bridge 46 and/or metal layer 30 may also be compensated for using printed conductors or webs 32.

In addition to the application of the method according to the present invention as an electrical contact through a substrate, the method may also be used for manufacturing individual insulated areas 48 on a substrate 16, as shown as an example in FIG. 11, or to manufacture a substrate on which at least one trenched, blocking conductive layer is applied or will be applied. Individual areas 48 are protected from parasitic effects, such as a so-called latch up, by a trench 12 or insulation trench, for example. One or more of these areas 48 may be electrically connected via one or more metal bridges 46, as shown in FIG. 11. It proves to be particularly advantageous for the manufacturing process that the etching process, e.g., a trenching process, for insulation may not take place until the end of processing after the structuring of the metal plating or of the metal plane.

During subsequent processing, many components are often embedded using a molding compound for protection, for example. The combination of these methods using open trenches 12 presented here, which are spanned by printed conductors or webs 32, proves to be particularly advantageous. The molding compound may entirely or partially fill trenches 12, whereby both the stamps and the printed conductors or webs 32 are additionally stabilized.

In principle, it is also possible to use a metal process having one or more metal layers prior to the etching process, e.g., the trenching process, if necessary. Metal bridges 15 shown in FIG. 11 may thus be formed, which may be formed with or without at least one dielectric layer in between, for example.

In FIG. 11, wafer 1 is made up of an SOI substrate, in which, for example, at least one substrate 16 is located on at least one insulation layer 28 and in turn one substrate 16. One or more contact areas may be established as insulated areas 48 on this layer sequence. For this purpose, an insulation trench 12 is provided, for example, trenched around the particular contact area. The contact area may have a substrate 16 made of a conductive or nonconductive material and may optionally additionally be provided with one or more circuits 17, 19 and/or have one or more differently doped areas. A transistor may thus be formed in one contact area, for example, to name one example of many possible embodiments for the contact area. Insulated contact areas 48 having their particular circuit or circuits 17, 19 and/or having one or more differently doped areas may be electrically connected to one another via at least one or more metal bridges 46 made up of at least one metal layer made of a metal or a metal alloy.

For example, three bridges 46 are provided in the example shown in FIG. 11, for three contacts 5 of circuit 19 of first insulated area 48, which is identified using a dot-dash circle, for example. One bridge 46 connects a contact 5 of a first circuit 17 of first insulated area 48 to a contact 5 of another circuit 17 of a second insulated contact area 48, left contact area 48 in FIG. 11 here. For this purpose, bridge 46 may optionally additionally be provided with insulation, for example, at least one dielectric layer, on the underside or the side facing insulation trench 12. Furthermore, two bridges 46, which are situated one on top of another, for example, connect a second and third contact 5 of second circuit 19 of first insulated contact area 48 to a first and second contact 5 of two other circuits 17 and 19 of a third insulated contact area 48, right insulated contact area 48 in FIG. 11 here.

In the example in FIG. 11, third insulated contact area 48 may in turn be connected to a contact 5 of a further circuit 17 of a further area 48 of substrate 16 via at least one bridge 46. Bridges 46, metal bridges here, for example, may be varied as desired with respect to their material, their position, their height, width, depth, and/or shape and may optionally additionally be provided with at least one or more perforations (not shown). Furthermore, in the case of multiple bridges 46, they may be situated adjacent to one another, i.e., in parallel, or at least partially one on top of another, insulation, such as at least one dielectric layer 34, which may be provided between the bridges in this case.

The configuration and design and connection of the circuits in FIG. 11, and of contacts 5 and bridges 46 in FIG. 11, are solely exemplary and the present invention is not restricted to the special exemplary embodiment.

Figure 12:
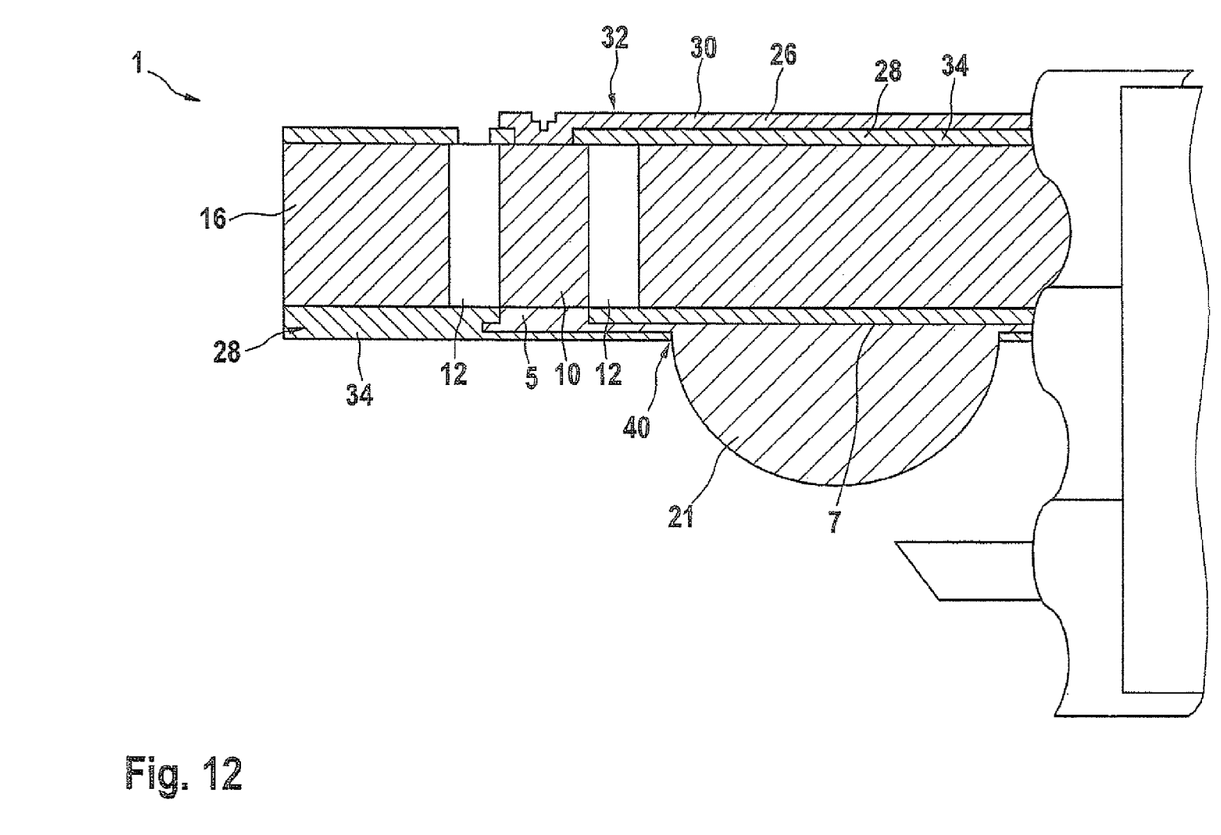
FIG. 12 shows a sectional view through a wafer or a substrate according to a specific embodiment of the present invention, in which a bond is provided on the underside of the substrate, for example.

Furthermore, a sectional view through a wafer 1 and a substrate 16 according to a specific embodiment of the present invention is shown in FIG. 12. Wafer 1 and substrate 16 have essentially the same structure as wafer 1 and substrate 16 in FIG. 7a. A through contact 10 is thus formed in substrate 16, which is enclosed by an insulation trench 12 and conductively connects a contact 5 on a first side of substrate 16, the underside of substrate 16 here, for example, to a metal plane 30 or a contact area 26 on the second side of substrate 16, the top side of substrate 16 here. Substrate 16 is implemented as conductive, for example, and has at least one or more webs 32, particular web 32 being used as a printed conductor, on the one hand, and on the other hand additionally stabilizing through contact 10. Web 32 has metal plane 30 made up of at least one metal layer in the example in FIG. 12 and optionally has at least one additional insulation layer 28 underneath, for example, at least one dielectric layer 34.

On the first side of substrate 16 or wafer 1, the underside here, for example, at least one insulation layer 28 is provided, for example, at least one dielectric layer 34, in which a contact 5 is accommodated, which is connected to substrate 16. Insulation layer 28 is provided with a contact opening 40, contact opening 40 being situated outside through contact 10 and its trench 12 and being sufficiently large so that a bond or bond pad 21 may be provided on contact 5 or a conductive connection section 7 of contact 5, as shown in FIG. 12. The bond or bond pad 21 may be dimensioned in such a way that it is spaced apart from trench 12 of through contact 10, as shown in FIG. 12, or partially or completely overlaps trench 12 and/or through contact 10 (not shown). Such a bond or bond pad 21 is particularly suitable for subsequent flip chip technology.

Figure 13:
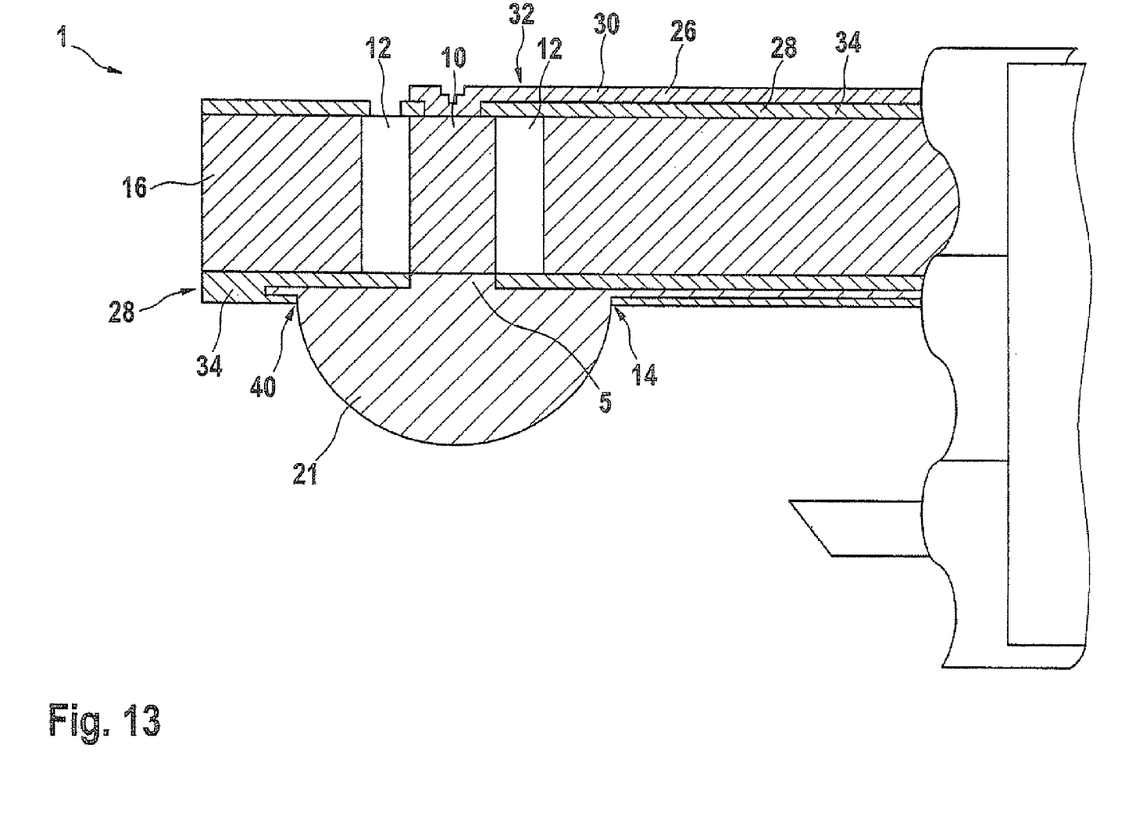
FIG. 13 shows a sectional view through a wafer or a substrate according to a further specific embodiment of the present invention.

FIG. 13 shows a sectional view through a wafer 1 and a substrate 16 according to a further specific embodiment of the present invention. Wafer 1 and substrate 16 have essentially the same structure as wafer 1 and substrate 16 in FIG. 7a and in FIG. 12. A through contact 10 is formed in substrate 16, which is enclosed by an insulation trench 12 and conductively connects a contact 5 on a first side of substrate 16, the underside of the substrate here, for example, to a metal plane 30 or a second contact area 26 on the second side of substrate 16, the top side of substrate 16 here. Substrate 16 is implemented as conductive, for example, and also has at least one or more webs 32, particular web 32 being used as a printed conductor, on the one hand, and on the other hand additionally stabilizing through contact 10. In the example in FIG. 13, web 32 has metal plane 30 made up of at least one metal layer and optionally additionally at least one insulation layer 28 underneath, for example, at least one dielectric layer 34.

As shown in FIG. 13, at least one insulation layer 28 is provided on the first side of substrate 16 of wafer 1, the underside here, for example, at least one dielectric layer 34, in which contact 5 is accommodated, which is connected to substrate 16. Insulation layer 28 is also provided with a contact opening 40. Contact opening 40 is situated below through contact 10 and its insulation trench 12, a bond or bond pad 21 being provided in contact opening 40 directly on contact 5. Bond or bond pad 21 is designed in such a way that it at least partially or completely overlaps through contact 10 and/or insulation trench 12 and terminates at the outer edge of insulation trench 12 or projects beyond it or protrudes beyond insulation trench 12, as shown as an example in FIG. 13. Such a bond or such a bond pad 21 is also particularly suitable for subsequent flip chip technology.

Figure 14:
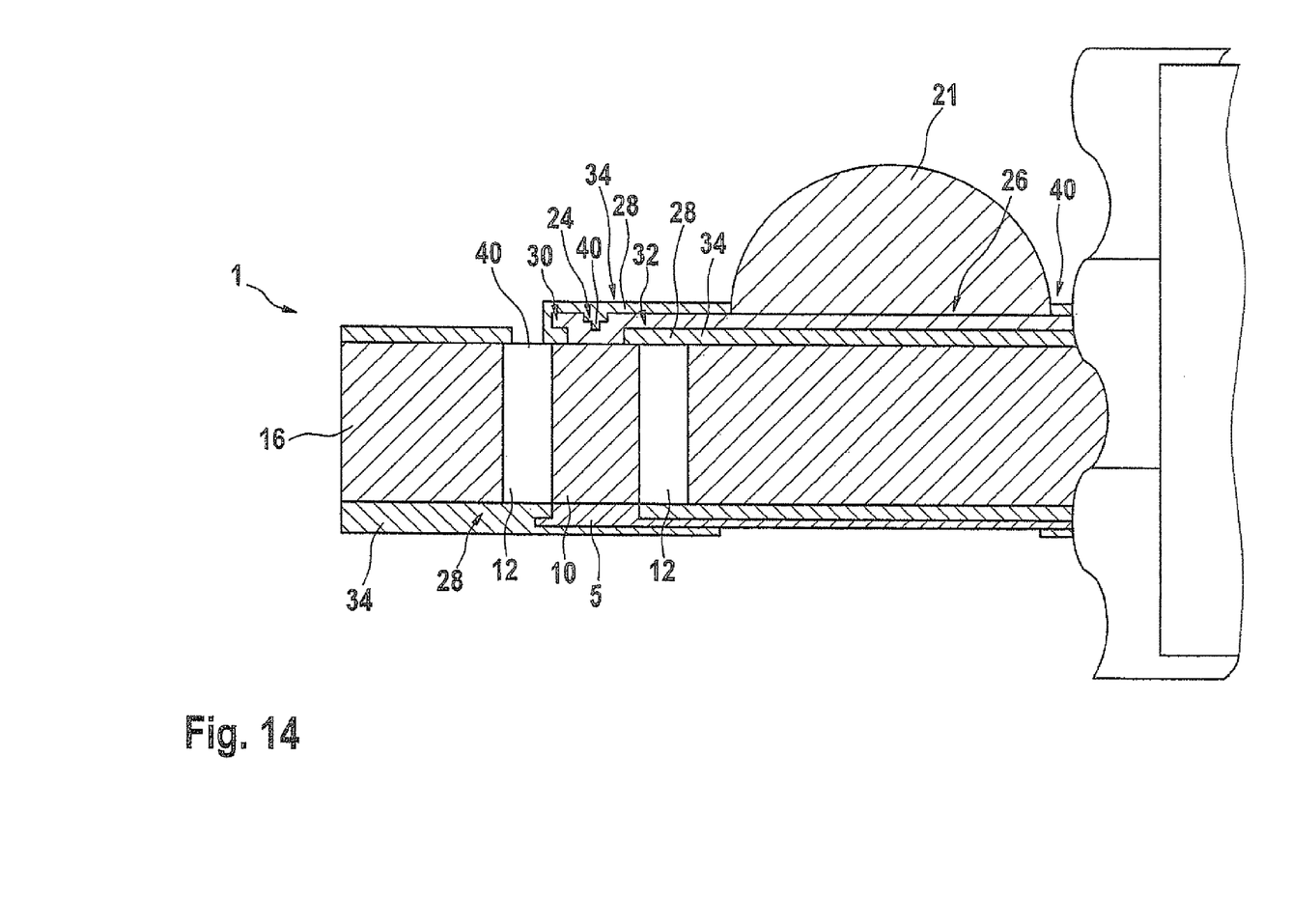
FIG. 14 shows a sectional view through a wafer or a substrate according to another specific embodiment of the present invention.

Furthermore, a sectional view through a wafer 1 and a substrate 16 according to another specific embodiment of the present invention is shown in FIG. 14. The specific embodiment in FIG. 14 essentially corresponds to the specific embodiment in FIG. 13, a bond or bond pad 21 being provided on the second side of substrate 16, the top side of substrate 16 here, for example, and being connected here via at least one web 32 or printed conductor to through contact 10. More precisely, substrate 16 has at least one insulation layer 28 (e.g., a dielectric layer 34) on its first side, the underside here, and a contact 5, which is connected to through contact 10. Through contact 10 is enclosed by an insulation trench 12 and is additionally stabilized by at least one web 32, web 32 furthermore also being implemented as a printed conductor to electrically connect the bond or bond pad 21 to through contact 10. On the second side of substrate 16, the top side here, at least one insulation layer 28, e.g., a dielectric layer 34, is initially provided. Insulation layer 28 was provided with an opening 40 over through contact 10 and insulation trench 12, as previously described on the basis of the exemplary embodiment in FIG. 7a, for example. Subsequently, a metal plane 30, which has at least one metal layer, has been applied to substrate 16 and structured, prior to insulation trench 12 having been formed. At least one insulation layer 28, e.g., a dielectric layer 34, may optionally additionally be applied to metal plane 30 and be provided with an opening 40 for a bond or a bond pad 21, as shown in FIG. 14.

Instead of insulation layer 28 having opening 40, the bond or bond pad 21 may also be applied directly to metal plane 30, however. The bond or bond pad 21 is spaced apart from insulation trench 12 of through contact 10 or situated outside insulation trench 12 and through contact 10 in a second contact area 26. First contact area 24 is contact area 24 which contacts through contact 10 in this case, as was described in the preceding exemplary embodiments.

In the exemplary embodiment in FIG. 14, the bond or bond pad 21, comparable to the specific embodiment according to FIG. 12, is dimensioned in such a way that it is spaced apart from trench 12 of through contact 10, as shown in FIG. 14, or partially or completely overlaps trench 12 and/or through contact 10 (not shown). Such a bond or such a bond pad 21 is also particularly suitable for subsequent flip chip technology.

Figure 15:
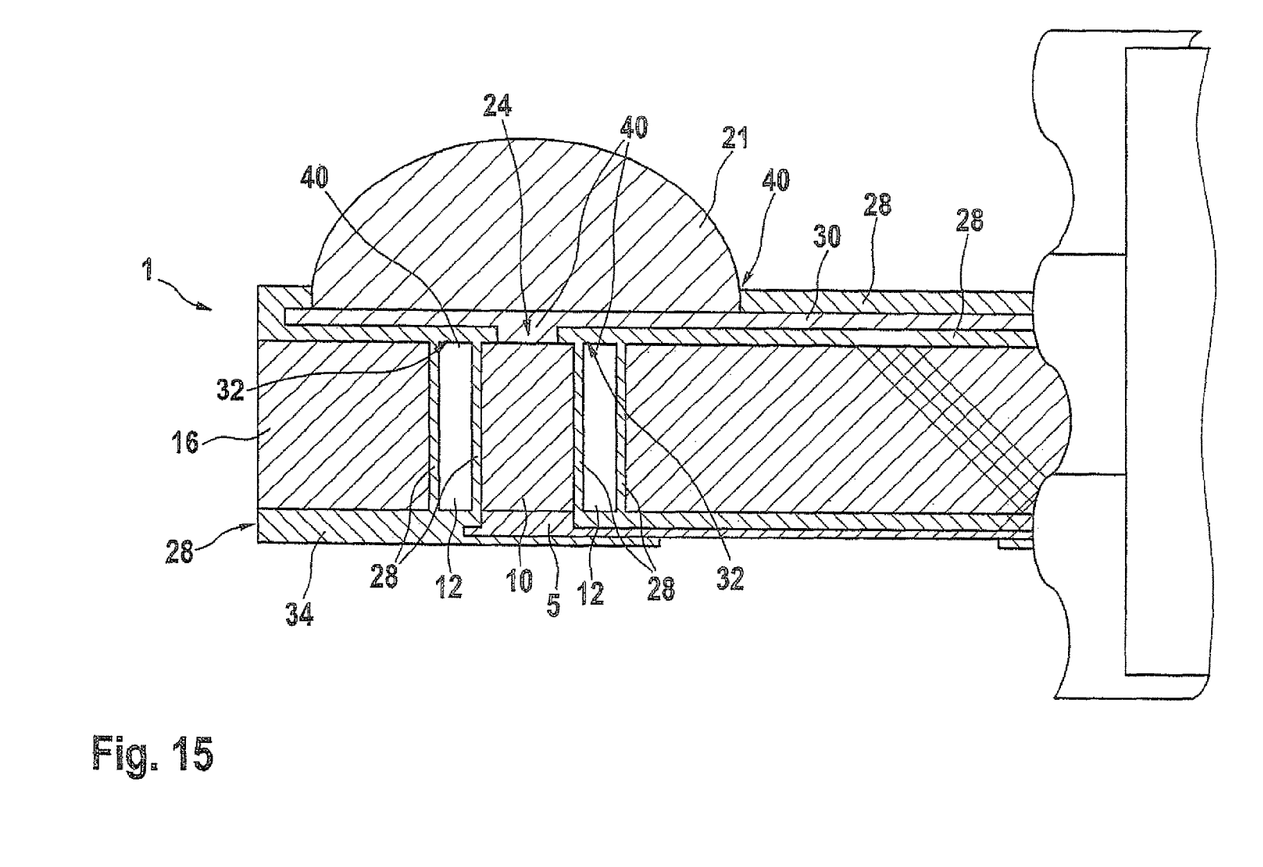
FIG. 15 shows a sectional view through a wafer or a substrate according to an additional specific embodiment of the present invention.

FIG. 15 shows a sectional view through a wafer 1 and a substrate 16 according to an additional specific embodiment of the present invention. In this case, wafer 1 and substrate 16 have essentially the same construction as wafer 1 and substrate 16 in FIG. 7a and FIG. 13. Substrate 16 has a through contact 10, which is enclosed by an insulation trench 12. A contact 5, which is connected to through contact 10, and at least one insulation layer 28 (e.g., a dielectric layer 34) are provided on a first side of substrate 16, the underside of the substrate here, for example.

On the second side of substrate 16, the top side of substrate 16 here, at least one insulation layer 28, e.g., a dielectric layer 34, is also provided. It is provided with an opening 40 for through contact 10 and insulation trench 12. Subsequently, a metal plane 30, which has at least one metal layer, is deposited on insulation layer 28 and in contact opening 40 of through contact 10. Insulation trench 12 is then etched and the one or more provided webs 32 are also etched or undercut. Webs 32 are additionally implemented as printed conductors, webs 32, as in the example in FIG. 15, additionally being able to have at least one insulation layer 28. Insulation trench 12 is additionally optionally insulated using at least one insulation layer 28, for example, an oxide layer or a dielectric layer, as shown in FIG. 15.

Finally, the bond or bond pad 21 may be provided directly on metal plane 30 over through contact 10 or first contact area 24 (not shown). Alternatively, at least one further insulation layer 28 may also initially be provided on metal plane 30 and this further insulation layer may be provided with an opening 40 for the bond or bond pad 21 over through contact 10 or first contact area 24, as shown as an example in FIG. 15. The bond or bond pad 21 is formed in such a way that it at least partially or completely overlaps through contact 10 and/or insulation trench 12 and terminates at the outer edge of insulation trench 12 or projects beyond it or protrudes beyond insulation trench 12, as shown as an example in FIG. 15. Such a bond or such a bond pad 21 is also particularly suitable for subsequent flip chip technology.

Although the present invention was described on the basis of exemplary embodiments, it is not restricted thereto, but rather may be modified in manifold ways. The above-mentioned specific embodiments may be combined with one another, in particular individual features thereof.

The exemplary embodiments and/or exemplary methods of the present invention may be used in particular for manufacturing sensors, such as acceleration sensors and yaw-rate sensors. The method may also be used as an insulation method in CMOS or BCD processes.

Furthermore, the exemplary embodiments and/or exemplary methods of the present invention may also be used, inter alfa, in flip chip processes, and for manufacturing ASICS or MEMS semiconductor components, to name only a few examples. The exemplary embodiments and/or exemplary methods of the present invention are not restricted to the examples of processes and semiconductor components.

What is claimed is:

1. A method for providing and connecting a first contact area to at least one second contact area on a conductive substrate, in the case of a semiconductor component, the method comprising:
    providing at least one insulation layer on a first surface of the substrate;
    identifying a through contact region of the conductive substrate including the first contact area;
    applying at least one first metal layer on the first surface of the substrate from the through contact region to the at least one second contact area outside the through contact region, the at least one first metal layer at least partially covering the insulation layer;
    forming an opening in each uncovered section of the first surface of at least one insulation layer around a perimeter of the through contact region;
    trenching each uncovered section of the first surface of the substrate around the perimeter of the through contact region to form an insulation trench around the perimeter;
    selecting a trenching parameter and a width of the applied at least one first metal layer so that a complete undercutting of the substrate occurs underneath a perimeter section of the substrate covered by the at least one first metal layer during the trenching; and
    forming a contact hole in the insulation layer, which connects the first contact area and the second contact area to one another, in addition to the opening in the insulation layer for the insulation trench.

2. The method of claim 1, wherein the insulation trench is formed using etching, wherein the etching is able to be performed using at least one of an isotropic etching process and an anisotropic etching process, and wherein the anisotropic etching process is a trenching process.

3. The method of claim 1, wherein the at least one first metal layer has one of a metal and a metal alloy, and wherein the one of the metal and the metal alloy has a tensile stress.

4. The method of claim 1, wherein at least one connection section is formed in the at least one metal layer, wherein the connection section is connected to the printed conductor of the first contact area, and wherein the connection section has at least one further printed conductor, using which the connection section connects the first contact area to the at least one second contact area.

5. The method of claim 1, wherein the insulation trench is formed having areas of various widths, and wherein an area of the insulation trench over which the printed conductor runs is formed so as to be less wide than an area of the insulation trench over which no printed conductor runs.

6. The method of claim 1, wherein at least one metal bridge for connecting the first contact area and the second contact area is formed, the formation including metal bridges over an insulation trench, at least two metal bridges of the metal bridges being formed situated parallel to one another or at least partially one on top of another, at least in the area where the two metal bridges are situated one on top of another, wherein at least one insulation layer is able to additionally be provided between the two metal bridges, and wherein at least one metal bridge has no perforation or at least one perforation.

7. The method of claim 1, wherein at least the first contact area at least one of (i) is formed as at least one of a through contact and at least one circuit, and (ii) has at least one area having a predetermined doping.

8. The method of claim 1, wherein the insulation trench is insulated using (i) at least one of at least one insulation layer, and (ii) a partial filling or a complete filling of the insulation trench, by using a molding compound.

9. The method of claim 1, wherein the insulation layer is formed by depositing at least one dielectric layer or oxide layer, and wherein at least one diffusion barrier layer, which is at least one of a titanium nitride (TiN) layer and a titanium tungsten (TiW) layer, is provided in addition to or instead of the insulation layer at least in the area of the printed conductor.

10. The method of claim 1, further comprising forming a bond or bond pad (i) in the first contact area, (ii) in the second contact area, or (iii) on a conductive connection section of a contact on a side opposite the first contact area and the second contact area, wherein the bond or bond pad at least partially covers an insulation trench of the first contact area or protrudes beyond the insulation trench, and wherein the insulation trench is able to be additionally insulated using at least one insulation layer.

\* \* \* \* \*